US012575405B2

(12) United States Patent (10) Patent No.: US 12,575,405 B2
Yen et al. (45) Date of Patent: Mar. 10, 2026

(54) SEMICONDUCTOR DEVICE WITH AIR GAP AND METHOD FOR MANUFACTURING THE SAME

(71) Applicant: TAIWAN SEMICONDUCTOR MANUFACTURING COMPANY, LTD., Hsinchu (TW)

(72) Inventors: Hung-Yu Yen, Hsinchu (TW); Keng-Chu Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 497 days.

(21) Appl. No.: 18/171,839

(22) Filed: Feb. 21, 2023

(65) Prior Publication Data

US 2024/0282622 A1     Aug. 22, 2024

(51) Int. Cl.
  *H01L 21/768* (2006.01)
  *H01L 23/532* (2006.01)
  *H10D 64/01* (2025.01)
(52) U.S. Cl.
  CPC .... *H01L 21/7682* (2013.01); *H01L 21/76826* (2013.01); *H01L 21/76877* (2013.01); *H01L 23/53209* (2013.01); *H10D 64/021* (2025.01)
(58) Field of Classification Search
  CPC ........... H01L 21/7682; H01L 21/76826; H01L 21/76877; H01L 21/76897; H01L 21/76831; H01L 23/53209; H01L 2221/1063; H10D 64/021; H10D 64/015; H10D 64/679; H10D 30/43; H10D 30/0212; H10D 30/014; H10D 62/121
See application file for complete search history.

(56) References Cited

U.S. PATENT DOCUMENTS 11,289,417 B2 * 3/2022 Chou .................... H10D 64/015
2018/0138280 A1 * 5/2018 Li ......................... H10D 62/021

* cited by examiner

*Primary Examiner* — Dale E Page
*Assistant Examiner* — Quovaunda Jefferson
(74) *Attorney, Agent, or Firm* — Birch, Stewart, Kolasch & Birch, LLP

(57) ABSTRACT

A method for manufacturing a semiconductor device includes: forming on a substrate, a structure including a plurality of dielectric spacers and a plurality of dielectric portions that are disposed to form a plurality of recesses, such that each of the recesses is formed between a corresponding one of the dielectric spacers and a corresponding one of the dielectric portions; and subjecting the dielectric spacers and the dielectric portions to a plasma treatment process such that the dielectric spacers and the dielectric portions are deformed to form a plurality of capping portions to cap the recesses, respectively, so as to form a plurality of air gaps.

20 Claims, 7 Drawing Sheets

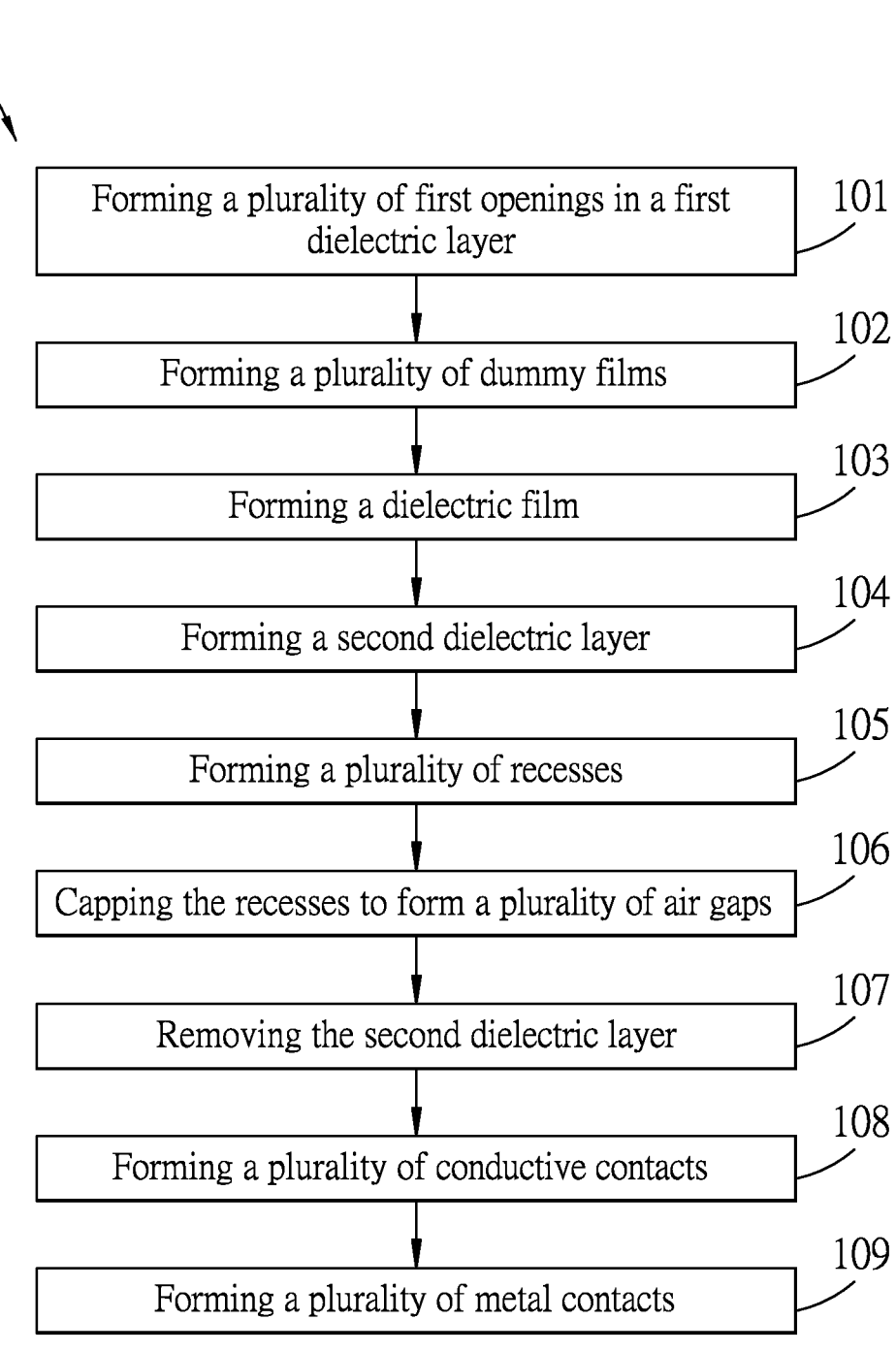

100

| Forming a plurality of first openings in a first dielectric layer | 101 |
| Forming a plurality of dummy films | 102 |
| Forming a dielectric film | 103 |
| Forming a second dielectric layer | 104 |
| Forming a plurality of recesses | 105 |
| Capping the recesses to form a plurality of air gaps | 106 |
| Removing the second dielectric layer | 107 |
| Forming a plurality of conductive contacts | 108 |
| Forming a plurality of metal contacts | 109 |

FIG. 1

SEMICONDUCTOR DEVICE WITH AIR GAP AND METHOD FOR MANUFACTURING THE SAME

BACKGROUND

With rapid development of semiconductor manufacturing technology, continual reduction in minimum feature sizes is a trend in the semiconductor industry. As the feature sizes in an integrated circuit (IC) chip are decreased, the distance between interconnect metal features (e.g., metal lines, metal contacts, or the like) is continually reduced in advanced nodes, which might induce resistance-capacitance (RC) delay and electronic signal interference. Therefore, the semiconductor industry strives to reduce the RC delay and the electronic signal interference of the IC chip so as to further improve chip performance.

In recent years, research on the use of air gaps in semiconductor devices to enhance the isolation among the interconnect metal features has been conducted in advanced process applications of semiconductor fabrication. Since air has the lowest dielectric constant value (k value) of 1, a growing trend has been to incorporate the air gaps into the semiconductor devices so as to isolate the interconnect metal features and reduce line-to-line capacitance and the RC time delay.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a flow diagram illustrating a method for manufacturing a semiconductor device in accordance with some embodiments.

DETAILED DESCRIPTION

Figure 2:
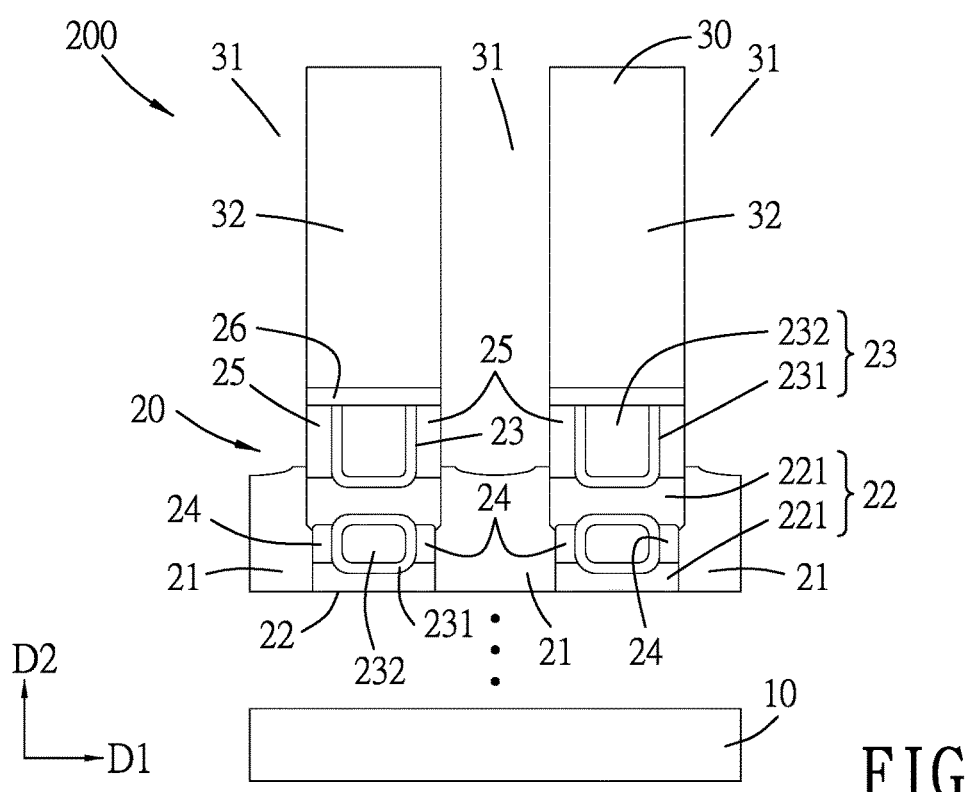
FIGS. 2 to 10 are schematic views illustrating some intermediate stages of the method as depicted in FIG. 1 in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," "upper," "lower," "downwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For the purposes of this specification and appended claims, unless otherwise indicated, all numbers expressing amounts, sizes, dimensions, proportions, shapes, formulations, parameters, percentages, quantities, characteristics, and other numerical values used in the specification and claims, are to be understood as being modified in all instances by the term "about" even though the term "about" may not expressly appear with the value, amount or range. Accordingly, unless indicated to the contrary, the numerical parameters set forth in the following specification and attached claims are not and need not be exact, but may be approximate and/or larger or smaller as desired, reflecting tolerances, conversion factors, rounding off, measurement error and the like, and other factors known to those of skill in the art depending on the desired properties sought to be obtained by the presently disclosed subject matter. For example, the term "about," when referring to a value can be meant to encompass variations of, in some aspects±10%, in some aspects±5%, in some aspects±2.5%, in some aspects±1%, in some aspects±0.5%, and in some aspects±0.1% from the specified amount, as such variations are appropriate to perform the disclosed methods or employ the disclosed compositions.

The present disclosure is directed to a method for manufacturing a semiconductor device having air gaps, which are formed among conductive features (for example, but not limited to, metal contacts disposed on source/drain regions of a nanosheet semiconductor device) by a plasma treatment process. FIG. 1 illustrates a method 100 for manufacturing a semiconductor device in accordance with some embodiments. FIGS. 2 to 10 are schematic views of a semiconductor device 200 at some intermediate stages of the manufacturing method as depicted in FIG. 1 in accordance with some embodiments. Additional steps can be provided before, after or during the method 100, and some of the steps described herein may be replaced by other steps or be eliminated. Similarly, further additional features may be present in the semiconductor device 200, and/or features present may be replaced or eliminated in additional embodiments.

Referring to FIG. 1 and the example illustrated in FIG. 2, the method 100 begins at step 101, where a plurality of first openings are formed in a first dielectric layer. FIG. 2 is a schematic view illustrating formation of a plurality of first openings 31 in a first dielectric layer 30 that is formed on a nanosheet structure 20 disposed on a substrate 10.

In some embodiments, the substrate 10 may be a semiconductor substrate. In some embodiments, the semiconductor substrate may include, for example, but not limited to, an elemental semiconductor or a compound semiconductor. The elemental semiconductor includes a single species of atoms, such as silicon (Si) or germanium (Ge) in column XIV of the periodic table, and may be in crystal, polycrystalline, or an amorphous form. Other suitable materials are within the contemplated scope of the present disclosure. The compound semiconductor includes two or more elements, and examples thereof may include, but not limited to, silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and gallium indium arsenide phosphide (GaInAsP). Other suitable materials are within the contemplated scope of the present disclosure. The compound semiconductor may have a gradient feature in which the composition ratio thereof changes from one location to another location in the compound semiconductor. The compound semiconductor may be formed over a silicon substrate and may be strained. In some embodiments, the semiconductor substrate 10 may include a multilayer compound semiconductor structure.

In some embodiments, the nanosheet structure 20 includes a plurality of source/drain regions 21, a plurality of channel regions 22, a plurality of gate structures 23, a plurality of inner spacers 24, a plurality of gate spacers 25, and an etch stop layer 26.

The source/drain regions 21 and the channel regions 22 are formed on the substrate 10. Two adjacent ones of the source/drain regions 21 are separated from each other by a corresponding one of the channel regions 22.

Each of the channel regions 22 includes a plurality of channel features 221 extending in a first direction (D1, a channel length direction) and disposed between two corresponding ones of the source/drain regions 21. The channel features 221 of each of the channel regions 22 are spaced apart from each other in a second direction (D2, a channel height direction) transverse to the first direction (D1). The channel features 221 are disposed to alternate with the inner spacers 24 in the second direction (D2). The channel features 221 serve as channels of the nanosheet structure 20. In some embodiments, the channel features 221 may be formed from, for example, but not limited to, silicon (Si) nanosheets.

In some embodiments, the source/drain regions 21 are formed by growing an epitaxial layer along the channel features 221 and the inner spacers 24. In addition, the source/drain regions 21 may be doped with germanium (Ge), boron (B), phosphorus (P), or arsenic (As). For example, in some embodiments, the epitaxial layer is grown along the channel features 221 and the inner spacers 24 through an epitaxial growth process with, for example, phosphorus doping when the source/drain regions 21 to be formed are n-FET source/drain regions. In some embodiments, the epitaxial layer is grown along the channel features 221 and the inner spacers 24 through an epitaxial growth process with, for example, geranium doping when the source/drain regions 21 to be formed are p-FET source/drain regions.

Each of the gate structures 23 includes an upper gate portion which is disposed on a corresponding one of the channel regions 22, and a lower gate portion which is disposed between two corresponding ones of the source/drain regions 21 and which surrounds the channel features 221 of the corresponding one of the channel regions 22. Each of the gate structures 23 includes a gate dielectric layer 231 and a metal filling layer 232 surrounded by the gate dielectric layer 231. In some embodiments, the gate dielectric layer 231 may include a suitable high-k material (for example, but not limited to, hafnium oxide (for example, but not limited to, HfO$_2$), zirconium oxide (for example, but not limited to, ZrO$_2$), zirconium aluminum oxide (ZrAlOx), hafnium aluminum oxide (HfAlOx), hafnium silicon oxide (HfSiOx), aluminum oxide (for example, but not limited to, Al$_2$O$_3$), or combinations thereof). Other suitable materials are within the contemplated scope of the present disclosure. In some embodiments, the metal filling layer 232 may include conductive metal (for example, but not limited to, aluminum (Al), copper (Cu), tungsten (W), cobalt (Co), ruthenium (Ru), titanium (Ti), tantalum (Ta), molybdenum (Mo), nickel (Ni), platinum (Pt), or combinations thereof), conductive metal nitride (for example, but not limited to, titanium nitride (TiN), tantalum nitride (TaN), or a combination thereof), conductive metal silicide (for example, but not limited to, nickel silicide (NiSi)), conductive metal carbide (for example, but not limited to, tantalum carbide (TaC)), or other suitable conductive materials.

The inner spacers 24 are disposed to laterally cover the lower gate portions of the gate structures 23 so as to separate the source/drain regions 21 from the lower gate portions of the gate structures 23. In some embodiments, the inner spacers 24 may include a suitable low-k (low dielectric constant) material (for example, but not limited to, silicon oxide (SiOx), silicon nitride (SiNx), silicon oxynitride (SiON), silicon carbonitride (SiCN), silicon oxycarbide (SiOC), silicon oxycarbonitride (SiOCN), or silicon carbide (SiC)). Other suitable materials are within the contemplated scope of the present disclosure.

The gate spacers 25 are disposed to laterally cover the upper gate portions of the gate structures 23. In some embodiments, the gate pacers 25 may include a suitable low-k material (for example, but not limited to, silicon oxide (SiOx), silicon nitride (SiNx), silicon oxynitride (SiON), silicon carbonitride (SiCN), silicon oxycarbide (SiOC), silicon oxycarbonitride (SiOCN), or silicon carbide (SiC)). Other suitable materials are within the contemplated scope of the present disclosure.

The etch stop layer 26 is disposed to cover the upper gate portions of the gate structures 23 and the gate spacers 25. In some embodiments, the etch stop layer 26 may include a suitable low-k material (for example, but not limited to, silicon oxide (SiOx), silicon nitride (SiNx), silicon oxynitride (SiON), silicon carbonitride (SiCN), silicon oxycarbide (SiOC), silicon oxycarbonitride (SiOCN), or silicon carbide (SiC)), a suitable high-k material (for example, but not limited to, hafnium oxide (for example, but not limited to, HfO$_2$), zirconium oxide (for example, but not limited to, ZrO$_2$), zirconium aluminum oxide (ZrAlOx), hafnium aluminum oxide (HfAlOx), hafnium silicon oxide (HfSiOx), or aluminum oxide (for example, but not limited to, Al$_2$O$_3$)), a combination thereof, or other suitable materials.

The first dielectric layer 30 is disposed to cover the nanosheet structure 20. In some embodiments, the first dielectric layer 30 includes a suitable low-k material (for example, but not limited to, silicon oxide (SiOx), silicon nitride (SiNx), silicon oxynitride (SiON), silicon carbonitride (SiCN), silicon oxycarbide (SiOC), silicon oxycarbonitride (SiOCN), or silicon carbide (SiC)). Other suitable materials are within the contemplated scope of the present disclosure. The first dielectric layer 30 is patterned by, for example, but not limited to, a photolithography process to remove portions of the first dielectric layer 30 over of the source/drain regions 21 so as to form a plurality of first openings 31 and to expose the source/drain regions 21. The first dielectric layer 30, after being patterned, includes a plurality of dielectric portions 32, and two adjacent ones of the dielectric portions 32 are spaced apart from each other by a corresponding one of the first openings 31.

Figure 3:
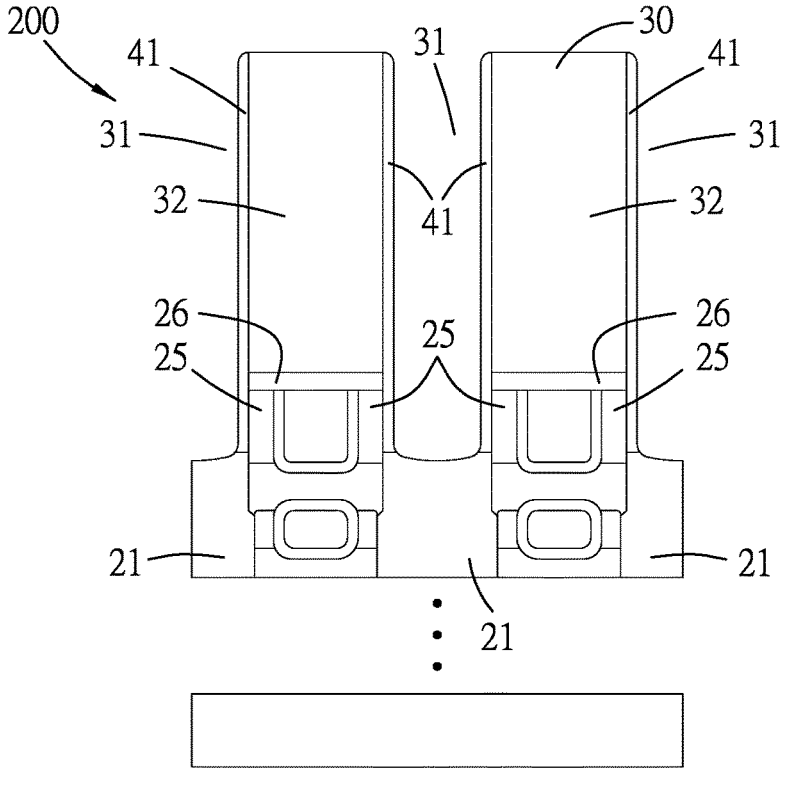

Referring to FIG. 1 and the example illustrated in FIG. 3, the method 100 proceeds to step 102, where a plurality of dummy films are formed. FIG. 3 is a schematic view illustrating formation of a plurality of dummy films 41 that laterally cover the dielectric portions 32 of the first dielectric layer 30, the etch stop layer 26, and the gate spacers 25. In some embodiments, formation of the dummy films 41 may be conducted by conformally forming a dummy material film (not shown) to cover the first dielectric layer 30, the etch stop layer 26, the gate spacers 25, and the source/drain regions 21, and anisotropically etching the dummy material film such that horizontal portions of the dummy material film are etched away to expose an upper surface of the first dielectric layer 30 and upper surfaces of the source/drain regions 21, thereby forming the dummy films 41. In some embodiments, the dummy material film may be conformally formed by a suitable deposition process, for example, but not limited to, chemical vapor deposition (CVD), plasma-enhanced CVD (PECVD), atomic layer deposition (ALD), plasma-enhanced ALD (PEALD), or other suitable deposition processes. In some embodiments, the dummy films 41 (or the dummy material film) may include, for example, but not limited to, a silicon-based material. In some embodiments, the dummy films 41 (or the dummy material film) may include, for example, but not limited to, silicon (Si), silicon oxide (SiOx), silicon nitride (SiNx), silicon oxynitride (SiON), silicon carbonitride (SiCN), silicon oxycarbide (SiOC), silicon oxycarbonitride (SiOCN), silicon carbide (SiC), or combinations thereof. Other suitable materials are within the contemplated scope of the present disclosure. In some embodiments, the dummy films 41 have a thickness ranging from about 1.0 nm to 10.0 nm.

Figure 4:
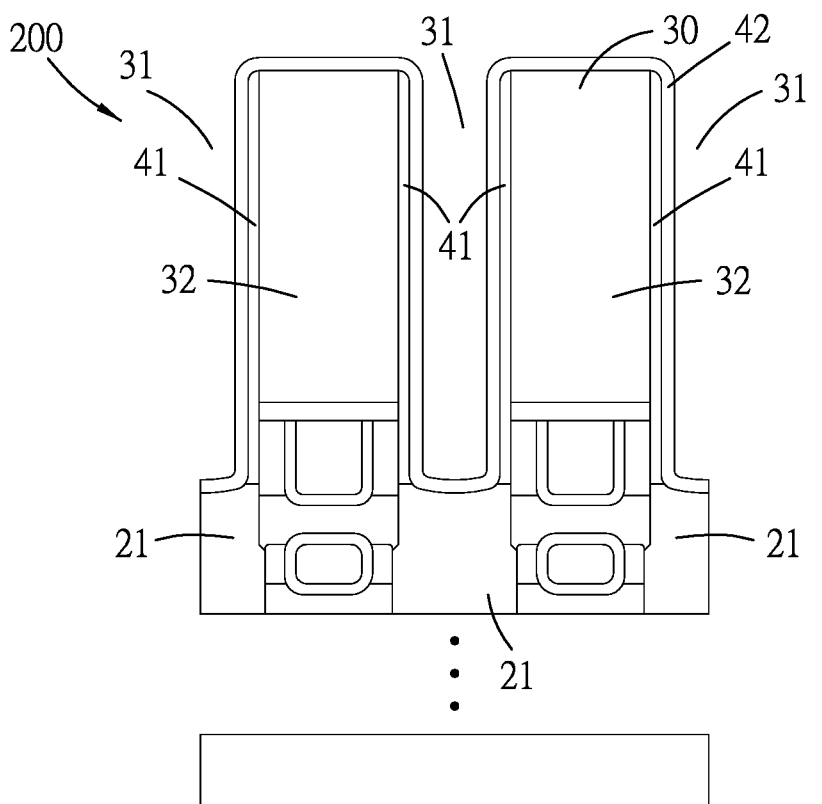

Referring to FIG. 1 and the example illustrated in FIG. 4, the method 100 proceeds to step 103, where a dielectric film is formed. FIG. 4 is a schematic view illustrating formation of a dielectric film 42 that conformally covers the structure shown in FIG. 3. In some embodiments, formation of the dielectric film 42 may be conducted by conformally depositing a dielectric material film to cover the first dielectric layer 30, the dummy films 41, and the source/drain regions 21. In some embodiments, the dielectric material film may be conformally formed by a suitable deposition process, for example, but not limited to, CVD, PECVD, ALD, PEALD, or other suitable deposition processes. In some embodiments, the dielectric film 42 (or the dielectric material film) may include, for example, but not limited to, a silicon-based dielectric material. In some embodiments, the dielectric film 42 (or the dielectric material film) may include, for example, but not limited to, silicon oxide (SiOx), silicon nitride (SiNx), silicon oxynitride (SiON), silicon carbonitride (SiCN), silicon oxycarbide (SiOC), silicon oxycarbonitride (SiOCN), silicon carbide (SiC), or combinations thereof. Other suitable materials are within the contemplated scope of the present disclosure. The silicon-based dielectric material of the dielectric film 42 is different from the silicon-based material of the dummy films 41. In some embodiments, the dielectric film 42 has a thickness ranging from about 2.0 nm to 5.0 nm. If the thickness of the dielectric film 42 is less than 2.0 nm, conductive features (for example, but not limited to, metal contacts to be formed subsequently) and the source/drain regions 21 cannot be isolated satisfactorily from each other. If the thickness of the dielectric film 42 is greater than 5.0 nm, parasitic capacitance among conductive features (for example, but not limited to, metal contacts to be formed subsequently) is increased undesirably.

Figure 5:
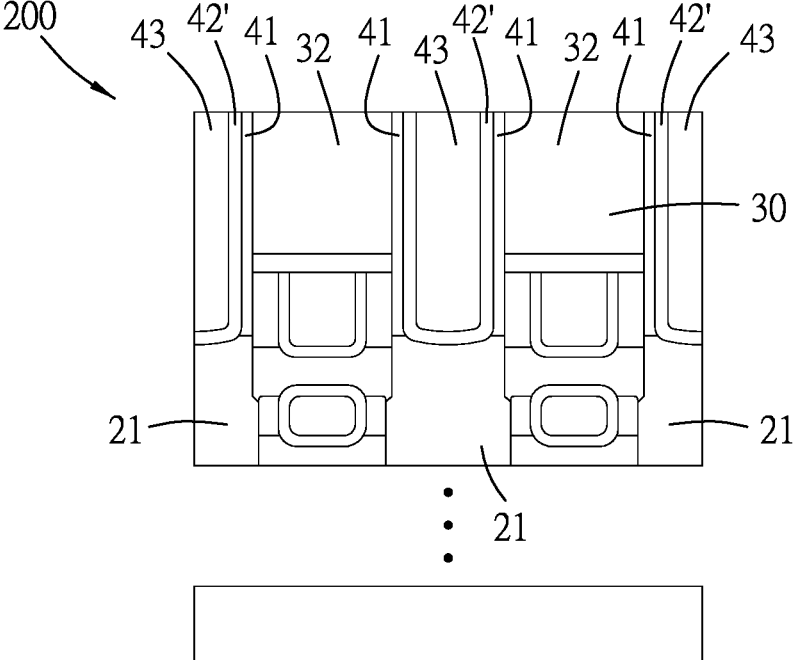

Referring to FIG. 1 and the example illustrated in FIG. 5, the method 100 proceeds to step 104, where a second dielectric layer is formed. FIG. 5 is a schematic view illustrating formation of a second dielectric layer 43 that fills the first openings 31 of the structure shown in FIG. 4. In some embodiments, formation of the second dielectric layer 43 may be conducted by forming a dielectric material layer (not shown) over the structure shown in FIG. 4 to fill the first openings 31, and then removing an upper portion of the dielectric material layer, upper portions of the dielectric film 42, and optionally upper portions of the first dielectric layer 30 and the dummy films 41 by a planarization process (for example, but not limited to, chemical mechanical planarization (CMP)), so as to expose the first dielectric layer 30 and the dummy films 41 and to form a plurality of dielectric spacers 42' that are disposed to isolate the second dielectric layer 43 from the dummy films 41 and the source/drain regions 21. In some embodiments, the dielectric material layer may be formed by a suitable deposition process, for example, but not limited to, CVD, PECVD, ALD, PEALD, or other suitable deposition processes. In some embodiments, the second dielectric layer 43 (or the dielectric material layer) may include, for example, but not limited to, a silicon-based dielectric material. In some embodiments, the second dielectric layer 43 (or the dielectric material layer) may include, for example, but not limited to, silicon oxide (SiOx), silicon nitride (SiNx), silicon oxynitride (SiON), silicon carbonitride (SiCN), silicon oxycarbide (SiOC), silicon oxycarbonitride (SiOCN), silicon carbide (SiC), or combinations thereof. The silicon-based dielectric material of the second dielectric layer 43 is different from the silicon-based dielectric material of the dielectric film 42, and is also different from the silicon-based material of the dummy films 41.

Figure 6:
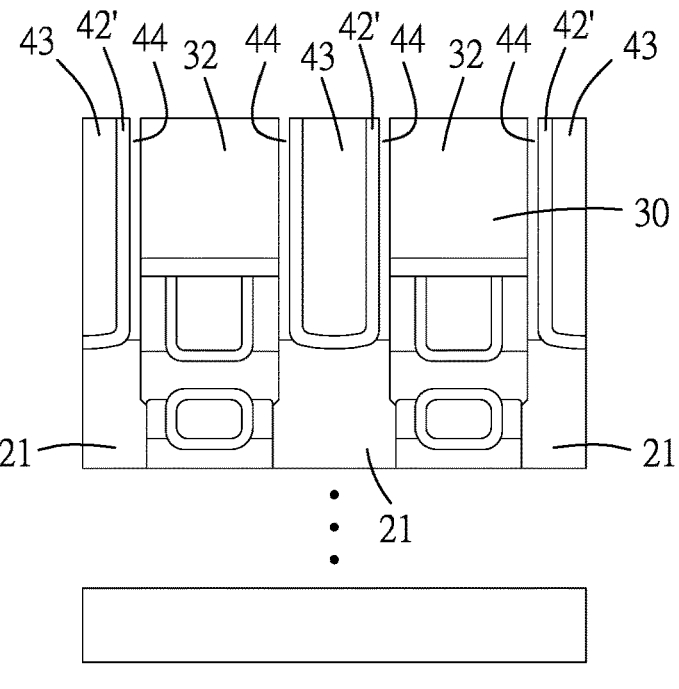

Referring to FIG. 1 and the example illustrated in FIG. 6, the method 100 proceeds to step 105, where a plurality of recesses are formed. FIG. 6 is a schematic view illustrating formation of a plurality of recesses 44, each of which is formed between a corresponding one of the dielectric portions 32 of the first dielectric layer 30 and a corresponding one of the dielectric spacers 42'. The recesses 44 extend downwardly to terminate at the source/drain regions 21. Formation of the recesses 44 may be conducted by removing the dummy films 41 of the structure shown in FIG. 5 using an isotropic etching process (for example, but not limited to, a wet etching process) based on a relatively high etching selectivity of the dummy films 41 with respect to the dielectric spacers 42', the first dielectric layer 30, and the second dielectric layer 43.

Figure 7:
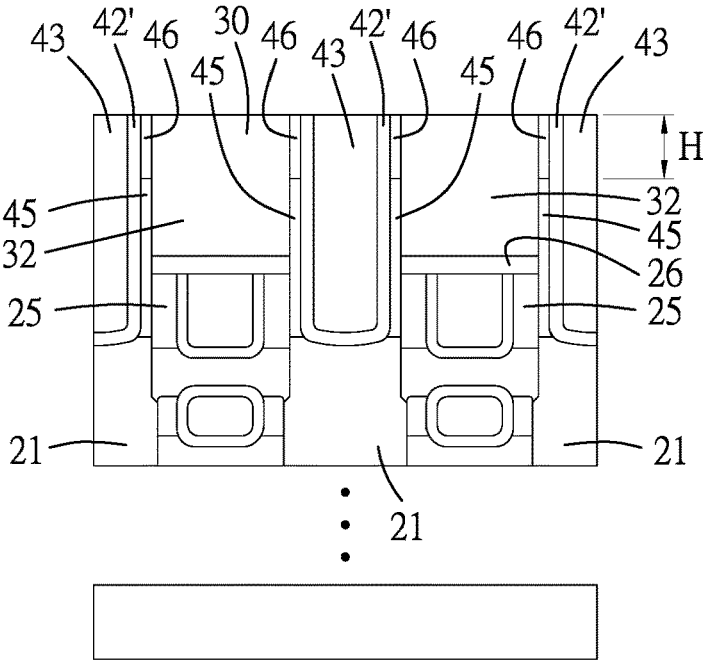

Referring to FIG. 1 and the example illustrated in FIG. 7, the method 100 proceeds to step 106, where the recesses are capped to form a plurality of air gaps. FIG. 7 is a schematic view illustrating formation of a plurality of air gaps 45 by capping the recesses 44 formed in the structure shown in FIG. 6 with a plurality of capping portions 46, respectively. Each of the air gaps 45 is confined by a corresponding one of the capping portions 46, a corresponding one of the dielectric spacers 42', a corresponding one of the source/drain regions 21, a corresponding one of the gate spacers 25, a corresponding portion of the etch stop layer 26, and a corresponding one of the dielectric portions 32 of the first dielectric layer 30. In some embodiments, the air gaps have a width ranging from about 1.0 nm to about 10.0 nm.

The dielectric spacers 42' and the dielectric portions 32 of the first dielectric layer 30 are subjected to a plasma treatment process such that parts of the dielectric spacers 42' and parts of the dielectric portions 32 of the first dielectric layer

30 are deformed to form a plurality of the capping portions 46, such that the recesses 44 formed in the structure shown in FIG. 6 are capped by the capping portions 46, respectively, thereby forming the air gaps 45. As described above, the dummy films 41 of the structure shown in FIG. 3 has a thickness ranging from about 1.0 nm to 10.0 nm. If the thickness of the dummy films 41 is less than 1.0 nm, the capping portions 46 thus formed have an insufficient height, and thus do not have excellent etching resistance during an etching process to be conducted subsequently. If the thickness of the dummy films 41 is more than 10.0 nm, the recesses 44 formed by removing the dummy films 41 cannot be capped successfully, and thus the air gaps 45 cannot be formed successfully. In some embodiments, the capping portions 46 has a height (H) ranging from about 2.0 nm to about 15.0 nm. If the height (H) of the capping portions 46 is less than 2.0 nm, the capping portions 46 do not have excellent etching resistance during an etching process to be conducted subsequently. If the height (H) of the capping portions 46 is more than 15.0 nm, parasitic capacitance among conductive features (for example, but not limited to, metal contacts to be formed subsequently) is increased undesirably.

In some embodiments, the plasma treatment process to form the capping portions 46 for capping the recesses 44 so as to form the air gaps 45 may be conducted using a suitable plasma treatment process, for example, but not limited to, an inductively coupled plasma (ICP) process, a capacitively coupled plasma (CCP) process, a microwave (MW) plasma process, or the like. Other suitable plasma treatment processes are within the contemplated scope of the present disclosure.

In some embodiments, the plasma treatment process may be conducted for a time period ranging from about 10 seconds (sec) to about 999 sec. If the plasma treatment process is conducted for a time period less than 10 sec, the capping portions 46 for capping the recesses 44 to form the air gaps 45 cannot be formed successfully. If the plasma treatment process is conducted for a time period more than 999 sec, the components proximate to the dielectric spacers 42' and the first dielectric layer 30 may be damaged after the plasma treatment process. In some embodiments, the time period for conducting the plasma treatment process may range from about 10 sec to about 60 sec. In some embodiments, the time period for conducting the plasma treatment process may range from about 61 sec to about 300 sec. In some embodiments, the time period for conducting the plasma treatment process may range from about 301 sec to about 999 sec.

In some embodiments, the plasma treatment process may be conducted at a plasma bias power ranging from about 10 W to about 999 W. If the plasma treatment process is conducted at a plasma bias power less than 10 W, the dielectric spacers 42' and the first dielectric layer 30 would not be deformed successfully to form the capping portions 46 for capping the recesses 44, and thus the air gaps 45 cannot be formed accordingly. If the plasma treatment process is conducted at a plasma bias power more than 999 W, the capping portions 46 thus formed would be damaged. The time period for conducting the plasma treatment process can be adjusted according to the plasma bias power used for the plasma treatment process. For example, the time period for conducting the plasma treatment process can be decreased when a relatively high plasma bias power is used. In some embodiments, the plasma treatment process may be conducted at a low plasma bias power ranging from about 10 W to about 100 W. In some embodiments, the plasma treatment process may be conducted at a middle plasma bias power ranging from about 101 W to about 300 W. In some embodiments, the plasma treatment process may be conducted at a high plasma bias power ranging from about 301 W to about 999 W.

In some embodiments, the gas source for generating the plasma ions and/or radicals for conducting the plasma treatment process may include, for example, but not limited to, nitrogen ($N_2$), argon (Ar), helium (He), oxygen ($O_2$), or combinations thereof. Other suitable gases are within the contemplated scope of the present disclosure.

In some embodiments, the power for dissociating the gas source into plasma ions and/or radicals for conducting the plasma treatment process may range from about 0.5 kW to about 3 kW. If the gas source is dissociated at a power less than 0.5 kW, the plasma ions and/or radicals for conducting the plasma treatment process would not be generated effectively, and thus the capping portions 46 may not be densified satisfactorily.

In some embodiments, the plasma treatment process may be conducted at a plasma pressure ranging from about 10 mT (milli-Torr) to about 100 T. If the plasma treatment process is conducted at a plasma pressure less than 10 mT, the capping portions 46 thus formed may not be densified satisfactorily. If the plasma treatment process is conducted at a plasma pressure greater than 100 T, the plasma treatment process would not be conducted successfully, and thus the air gaps 45 cannot be formed accordingly.

In some embodiments, the plasma treatment process may be conducted at a temperature ranging from about 350° C. to about 500° C. If the plasma treatment process is conducted at a temperature less than 350° C., the capping portions 46 thus formed may not be densified satisfactorily. If the plasma treatment process is conducted at a temperature more than 500° C., the semiconductor device 200 may be damaged.

Figure 11:
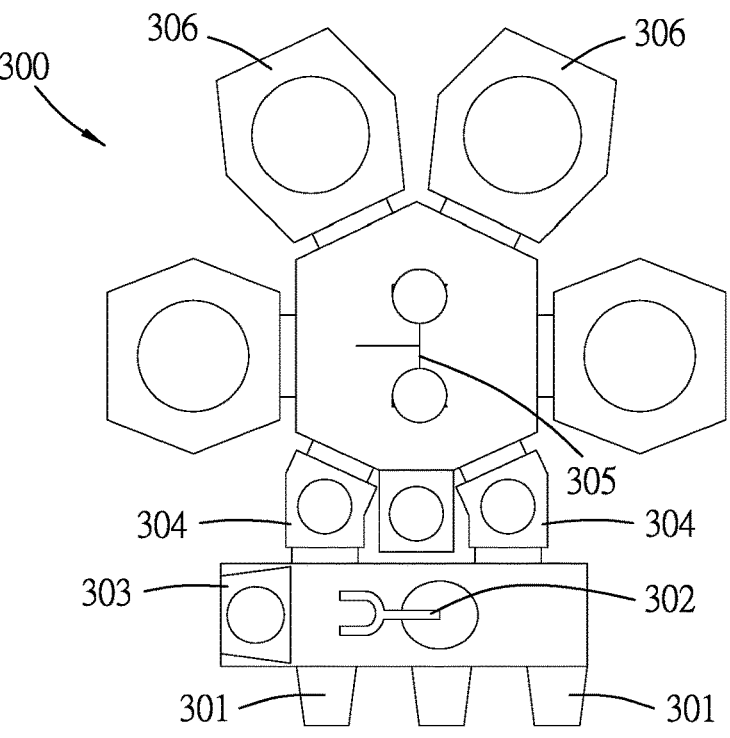
FIG. 11 is a schematic view illustrating a plasma processing system used in the manufacturing method as depicted in FIG. 1 in accordance with some embodiments.

FIG. 11 is a schematic view illustrating a plasma processing system for conducting the plasma treatment process in the manufacturing method 100 in accordance with some embodiments. A plasma processing system 300 includes a plurality of load ports 301, a first wafer transfer unit 302, a wafer orienter 303, a plurality of load lock modules 304, a second wafer transfer unit 305, and a plurality of chambers 306.

Each of the load ports 301 is configured to receive a FOUP (Front Opening Unified Pod), which is a container with a highly clean environment for accommodating semiconductor wafers therein. The plasma processing system 300 illustrated in FIG. 11 includes three of the load ports 301. However, it should be noted that any number of the load ports 301 can be included in the plasma processing system 300.

The first wafer transfer unit 302 is configured to pick-up and place the semiconductor wafers so as to transport the semiconductor wafers among the load ports 301, the wafer orienter 303, and the load lock modules 304. In some embodiments, the first wafer transfer unit 302 may be configured as a robotic arm. However, it should be noted that the first wafer transfer unit 302 may include any suitable mechanism or device for transferring the semiconductor wafers.

The wafer orienter 303 is configured to orient the semiconductor wafers before the semiconductor wafers are subjected the plasma treatment process in the chambers 306. It should be noted that in some embodiments, more than one of the wafer orienter 303 may be included in the plasma processing system 300.

The load lock modules 304 are configured to create an atmosphere compatible with that of the chambers 306. In some embodiments, the load lock modules 304 and the chambers 306 are maintained at a pressure below an atmospheric pressure, while the remaining areas (for example, the load ports 301 and the wafer orienter 303) are maintained at the atmospheric pressure. Each of the load lock modules 304 may be configured to operate as an air lock between the chambers 306 and the remaining areas (for example, the load ports 301 and the wafer orienter 303) of the plasma processing system 300. The load lock modules 304 may be configured to be sealed, evacuated, and vented. In some embodiments, before transferring one of the semiconductors wafers into or out of one of the chambers 306, one of the load lock modules 304 is sealed and evacuated such that the pressure within the one of the load lock modules 304 is equal to the pressure within the chambers 306. Additionally, before the first wafer transfer unit 302 places one of the semiconductor wafers to be processed from the wafer orienter 303 on one of the load lock modules 304 or picks-up a processed one of the semiconductor wafers from one of the load lock modules 304, the one of the load lock modules 304 is vented such that the pressure within the one of the load lock modules 304 is equal to the pressure within the load ports 301 and the wafer orienter 303 of the plasma processing system 300.

The second wafer transfer unit 305 is configured to pick-up and place the semiconductor wafers so as to transport the semiconductor wafers between the load lock modules 304 and the chambers 306. In some embodiments, the second wafer transfer unit 305 may be configured as a robotic arm. However, it should be noted that the second wafer transfer unit 305 may include any suitable mechanism or device for transferring the semiconductor wafers.

The chambers 306 are configured to subject the semiconductor wafers to the plasma treatment process at a relatively low pressure (for example, a pressure below an atmospheric pressure) so as to reduce or eliminate the flow of contaminants from the chambers 306 into other areas of the plasma processing system 300.

Figure 14:
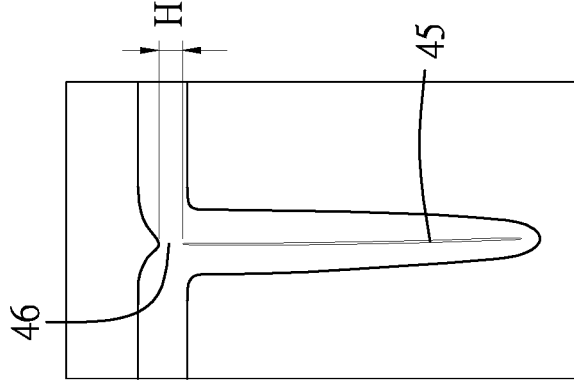
FIGS. 12 to 14 are fragmentary views each illustrating an air gap formed in a semiconductor device at an intermediate stage of the method as depicted in FIG. 1 in accordance with some embodiments.
Figure 13:
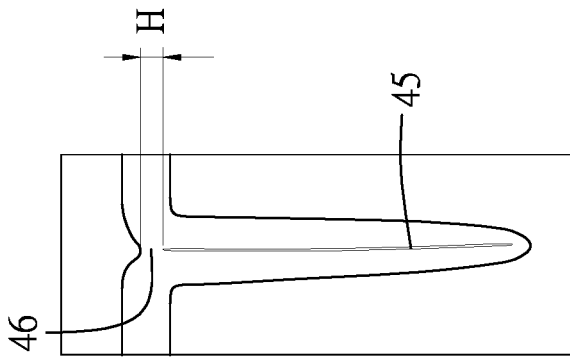
Figure 12:
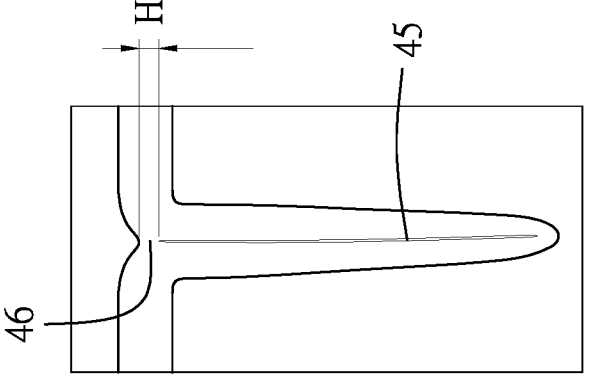

FIG. 12 illustrates a fragmentary view of the semiconductor device 200 in accordance with the some embodiments, in which the plasma treatment process is conducted at the low plasma bias power ranging from about 10 W to about 100 W. The height (H) of the capping portion 46 thus formed ranges from about 2.0 nm to about 8.5 nm. FIG. 13 illustrates a fragmentary view of the semiconductor device 200 in accordance with the some embodiments, in which the plasma treatment process is conducted at the middle plasma bias power ranging from about 101 W to about 300 W. The height (H) of the capping portion 46 thus formed ranges from about 8.5 nm to about 12.0 nm. FIG. 14 illustrates a fragmentary view of the semiconductor device 200 in accordance with the some embodiments, in which the plasma treatment process is conducted at the high plasma bias power ranging from about 301 W to about 999 W. The height (H) of the capping portion 46 thus formed ranges from about 12.0 nm to about 15.0 nm.

Figure 8:
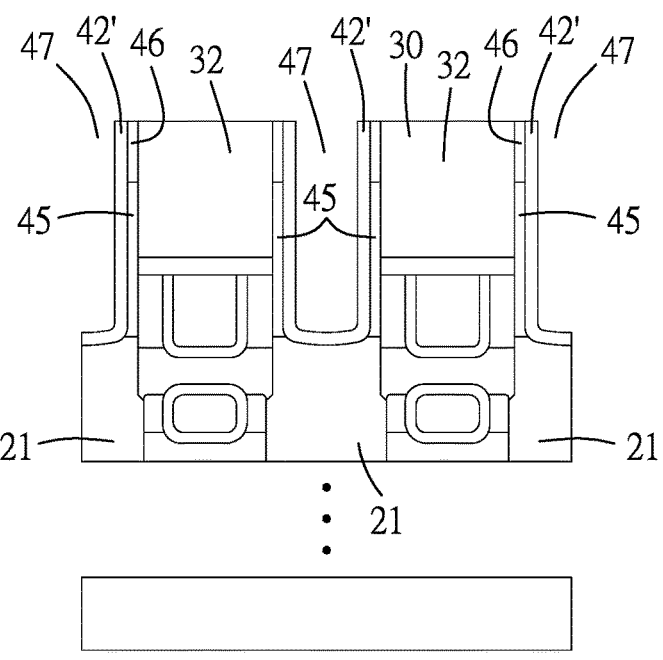

Referring to FIG. 1 and the examples illustrated in FIGS. 7 and 8, the method 100 proceeds to step 107, where the second dielectric layer is removed. FIG. 8 is a schematic view illustrating formation of a plurality of second openings 47 by removing the second dielectric layer 43 of the structure shown in FIG. 7. In some embodiments, the second dielectric layer 43 may be removed by an isotropic etching process (for example, but not limited to, a wet etching process) based on a relatively high etching selectivity of the second dielectric layer 43 with respect to the dielectric spacers 42', the first dielectric layer 30, and the capping portions 46.

Figure 9:
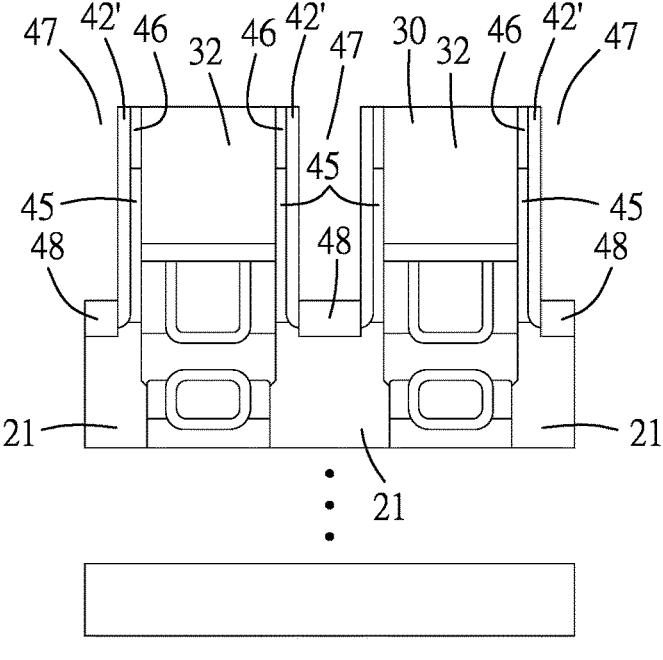

Referring to FIG. 1 and the examples illustrated in FIG. 9, the method 100 proceeds to step 108, where a plurality of conductive contacts are formed. FIG. 9 is a schematic view illustrating formation of a plurality of conductive contacts 48 on the source/drain regions 21, respectively. Bottom portions of the dielectric spacers 42' of the structure shown in FIG. 8 are removed by, for example, but not limited to, an anisotropic etching process so as to expose the source/drain regions 21. Thereafter, the conductive contacts 48 may be formed on the source/drain regions 21, respectively, by a suitable formation process known to those skilled in the art of semiconductor fabrication. For example, in some embodiments in which the conductive contacts 48 are made of metal silicide, the conductive contacts 48 may be formed by a pre-silicidation implantation process in which implant regions are formed, followed by a silicidation process in which the implant regions are subjected to a silicidation process so as to form the conductive contacts 48. In the pre-silicidation implantation process, dopants (for example, but not limited to, metal dopants) are implanted through second openings 47. In some embodiments, the silicidation process may include an annealing operation, the conductive contacts 48 made of metal silicide are formed only in the implant regions including the metal dopants, and the conductive contacts 48 made of metal silicide are formed after the annealing operation. In some embodiments, the conductive contacts 48 may include, for example, but are not limited to, a metal silicide material. Examples of the metal silicide material may include titanium silicide ($Ti_xSi_y$), molybdenum silicide ($Mo_xSi_y$), nickel silicide ($Ni_xSi_y$), ruthenium silicide ($Ru_xSi_y$), cobalt silicide ($Co_xSi_y$), tungsten silicide ($W_xSi_y$), europium silicide ($Eu_xSi_y$), erbium silicide ($Er_xSi_y$), titanium germanosilicide ($Ti_xSi_yGe_z$), molybdenum germanosilicide ($Mo_xSi_yGe_z$), nickel germanosilicide ($Ni_xSi_yGe_z$), ruthenium germanosilicide ($Ru_xSi_yGe_z$), cobalt germanosilicide ($Co_xSi_yGe_z$), tungsten germanosilicide ($W_xSi_yGe_z$), europium germanosilicide ($Eu_xSi_yGe_z$), erbium germanosilicide ($Er_xSi_yGe_z$), and the like, and combinations thereof, but are not limited thereto. Other suitable materials are within the contemplated scope of the present disclosure.

Figure 10:
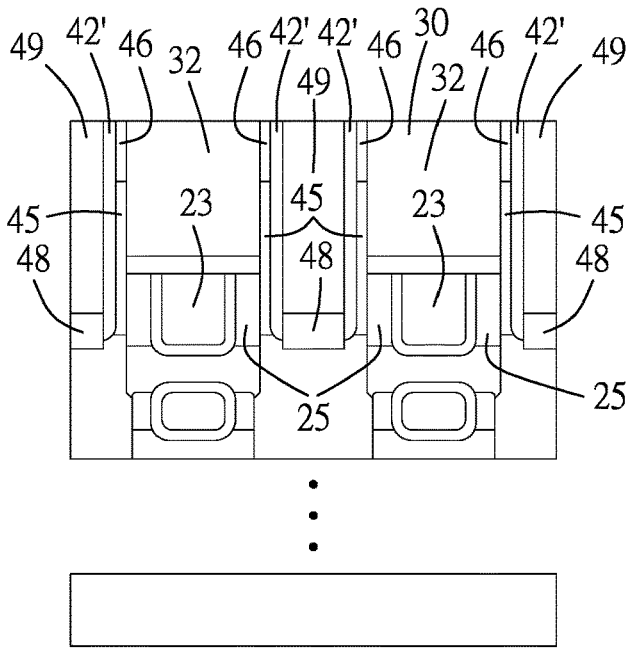

Referring to FIG. 1 and the examples illustrated in FIG. 10, the method 100 proceeds to step 109, where a plurality of metal contacts are formed. FIG. 10 is a schematic view illustrating formation of a plurality of metal contacts 49 on the conductive contacts 48, respectively. A metal material is filled into the remaining volume of the second openings 47 in the structure shown in FIG. 9 by reflowing, direct plating (for example, but not limited to, electro-chemical plating (ECP)), a suitable deposition process as is known to those skilled in the art of semiconductor fabrication (for example, but not limited to, selective or non-selective PVD, selective or non-selective CVD, selective or non-selective PECVD, selective or non-selective ALD, selective or non-selective PEALD, electroless deposition (ELD)), or the like, and a planarization process (e.g., CMP) is then performed to remove excess of the metal material over the dielectric spacers 42', the first dielectric layer 30, and the capping portions 46 so as to form the metal contacts 49. In some embodiments, the metal material for forming the metal contacts 49 may include, for example, but not limited to, metals (for example, but not limited to, aluminum (Al), copper (Cu), tungsten (W), cobalt (Co), ruthenium (Ru), titanium (Ti), tantalum (Ta), molybdenum (Mo), nickel (Ni), platinum (Pt)), alloys thereof possessing promising conductive properties, or the like. Other suitable metal materials are within the contemplated scope of the present disclosure.

In a method for manufacturing a semiconductor device of the present disclosure, dielectric spacers and dielectric portions of a dielectric layer are subjected to a plasma treatment process such that parts of the dielectric spacers and parts of the dielectric portions of the dielectric layer are deformed to form a plurality of capping portions for capping a plurality of recesses formed among the dielectric spacers and the dielectric portions of the dielectric layer so as to form a plurality of air gaps among interconnect metal features (e.g., metal contacts disposed on source/drain regions of a nanosheet semiconductor device). The plasma treatment process for forming the air gaps is simple and well-controlled. In addition, the air gaps formed among the interconnect metal features have the lowest k value (k=1), and thus the line-to-line capacitance and the RC time delay can be effectively reduced.

In accordance with some embodiments of the present disclosure, a method for manufacturing a semiconductor device includes: forming on a substrate, a structure including a plurality of dielectric spacers and a plurality of dielectric portions that are disposed to form a plurality of recesses, such that each of the recesses is formed between a corresponding one of the dielectric spacers and a corresponding one of the dielectric portions; and subjecting the dielectric spacers and the dielectric portions to a plasma treatment process such that the dielectric spacers and the dielectric portions are deformed to form a plurality of capping portions to cap the recesses, respectively, so as to form a plurality of air gaps.

In accordance with some embodiments of the present disclosure, the plasma treatment process is conducted for a time period ranging from about 10 sec to about 999 sec.

In accordance with some embodiments of the present disclosure, the plasma treatment process is conducted at a plasma bias power ranging from about 10 W to about 999 W.

In accordance with some embodiments of the present disclosure, the plasma treatment process is conducted at a plasma pressure ranging from about 10 mT to about 100 T.

In accordance with some embodiments of the present disclosure, the plasma treatment process is conducted at a temperature ranging from about 350° C. to about 500° C.

In accordance with some embodiments of the present disclosure, the plasma treatment process is conducted using a gas source to generate plasma ions or radicals, the gas source including nitrogen, argon, helium, oxygen, or combinations thereof.

In accordance with some embodiments of the present disclosure, the plasma ions or radicals are generated at a power ranging from about 0.5 kW to about 3 kW.

In accordance with some embodiments of the present disclosure, the method for manufacturing a semiconductor device further includes forming a plurality of dummy films, each of which is disposed between a corresponding one of the dielectric spacers and a corresponding one of the dielectric portions. The recesses is formed by removing the dummy films using an isotropic etching process based on a relatively high etching selectivity of the dummy films with respect to the dielectric spacers and the dielectric portions.

In accordance with some embodiments of the present disclosure, the method for manufacturing a semiconductor device further includes further includes forming a plurality of metal contacts, each of which is laterally covered by a corresponding one of the dielectric spacers.

In accordance with some embodiments of the present disclosure, a method for manufacturing a semiconductor device includes: forming on a substrate, a structure including a plurality of dielectric spacers, a plurality of dielectric portions, and a dielectric layer that are disposed to permit the dielectric layer to be filled into openings defined by the dielectric spacers and to form a plurality of recesses among the dielectric spacers and the dielectric portions, such that each of the recesses is formed between a corresponding one of the dielectric spacers and a corresponding one of the dielectric portions; and subjecting the dielectric spacers and the dielectric portions to a plasma treatment process such that the dielectric spacers and the dielectric portions are deformed to form a plurality of capping portions for capping the recesses, respectively, so as to form a plurality of air gaps.

In accordance with some embodiments of the present disclosure, the plasma treatment process is conducted at a plasma bias power ranging from about 10 W to about 100 W such that the capping portions has a height ranging from about 2.0 nm to about 8.5 nm.

In accordance with some embodiments of the present disclosure, the plasma treatment process is conducted at a plasma bias power ranging from about 101 W to about 300 W such that the capping portions has a height ranging from about 8.5 nm to about 12.0 nm.

In accordance with some embodiments of the present disclosure, the plasma treatment process is conducted at a plasma bias power ranging from about 301 W to about 999 W such that the capping portions has a height ranging from about 12.0 nm to about 15.0 nm.

In accordance with some embodiments of the present disclosure, the method for manufacturing a semiconductor device further incudes forming a plurality of dummy films, each of which is disposed between a corresponding one of the dielectric spacers and a corresponding one of the dielectric portions. The recesses is formed by removing the dummy films using an isotropic etching process based on a relatively high etching selectivity of the dummy films with respect to the dielectric spacers, the dielectric portions, and the dielectric layer.

In accordance with some embodiments of the present disclosure, the method for manufacturing a semiconductor device further incudes removing the dielectric layer using an isotropic etching process based on a relatively high etching selectivity of the dielectric layer with respect to the dielectric spacers, the dielectric portions, and the capping portions; removing bottom portions of the dielectric spacers by an anisotropic etching process; and filling a metal material into the openings so as to form a plurality of metal contacts, each of which is laterally covered by a corresponding one of the dielectric spacers.

In accordance with some embodiments of the present disclosure, a semiconductor device includes a substrate, a semiconductor structure, a plurality of dielectric portions, and a plurality of capping portions. The semiconductor structure is disposed on the substrate and includes a plurality of source/drain regions, a plurality of channel regions disposed to alternate with the source/drain regions, a plurality of metal contacts disposed on the source/drain regions, respectively, and a plurality of dielectric spacers laterally covering the metal contacts, respectively. The dielectric portions are disposed on the channel regions, respectively. Each of the capping portions is disposed between a corresponding one of the dielectric spacers and a corresponding one of the dielectric portions to cap a plurality of air gaps, respectively. Each of the air gaps is formed between a corresponding one of the dielectric spacers and a corresponding one of the dielectric portions.

In accordance with some embodiments of the present disclosure, the air gaps have a width ranging from about 1.0 nm to about 10.0 nm.

In accordance with some embodiments of the present disclosure, the capping portions have a height ranging from about 2.0 nm to about 15.0 nm.

In accordance with some embodiments of the present disclosure, the dielectric spacers have a thickness ranging from about 2.0 nm to about 5.0 nm.

In accordance with some embodiments of the present disclosure, the semiconductor device further includes a plurality of gate structures and a plurality of gate spacers. Each of the gate structures includes an upper gate portion disposed on a corresponding one of the channel regions and a lower gate portion disposed between two corresponding ones of the source/drain regions. Each of the gate spacers laterally covers the upper gate portion of a corresponding one of the gate structures, such that each of the air gaps is formed between a corresponding one of the gate spacers and a corresponding one of the dielectric spacers.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:

forming on a substrate, a structure including a plurality of dielectric spacers and a plurality of dielectric portions that are disposed to form a plurality of recesses, such that each of the plurality of recesses is formed between a corresponding one of the plurality of dielectric spacers and a corresponding one of the plurality of dielectric portions; and subjecting the plurality of dielectric spacers and the plurality of dielectric portions to a plasma treatment process such that the plurality of dielectric spacers and the plurality of dielectric portions are deformed to form a plurality of capping portions to cap the plurality of recesses, respectively, so as to form a plurality of air gaps.

2. The method according to claim 1, wherein the plasma treatment process is conducted for a time period ranging from 10 sec to 999 sec.

3. The method according to claim 1, wherein the plasma treatment process is conducted at a plasma bias power ranging from 10 W to 999 W.

4. The method according to claim 1, wherein the plasma treatment process is conducted at a plasma pressure ranging from 10 mT to 100 T.

5. The method according to claim 1, wherein the plasma treatment process is conducted at a temperature ranging from 350° C. to 500° C.

6. The method according to claim 1, wherein the plasma treatment process is conducted using a gas source to generate plasma ions or radicals, the gas source including nitrogen, argon, helium, oxygen, or combinations thereof.

7. The method according to claim 6, wherein the plasma ions or radicals are generated at a power ranging from 0.5 kW to 3 kW.

8. The method according to claim 1, further comprising forming a plurality of dummy films, each of which is disposed between a corresponding one of the plurality of dielectric spacers and a corresponding one of the plurality of dielectric portions, the plurality of recesses being formed by removing the plurality of dummy films using an isotropic etching process based on a relatively high etching selectivity of the plurality of dummy films with respect to the plurality of dielectric spacers and plurality of the dielectric portions.

9. The method according to claim 1, further comprising forming a plurality of metal contacts, each of which is laterally covered by a corresponding one of the plurality of dielectric spacers.

10. A method for manufacturing a semiconductor device, comprising:

forming on a substrate, a structure including a plurality of dielectric spacers, a plurality of dielectric portions, and a dielectric layer that are disposed to permit the dielectric layer to be filled into openings defined by the plurality of dielectric spacers and to form a plurality of recesses among the plurality of dielectric spacers and the plurality of dielectric portions, such that each of the plurality of recesses is formed between a corresponding one of the plurality of dielectric spacers and a corresponding one of the plurality of dielectric portions; and subjecting the plurality of dielectric spacers and the plurality of dielectric portions to a plasma treatment process such that the plurality of dielectric spacers and the plurality of dielectric portions are deformed to form a plurality of capping portions for capping the plurality of recesses, respectively, so as to form a plurality of air gaps.

11. The method according to claim 10, wherein the plasma treatment process is conducted at a plasma bias power ranging from 10 W to 100 W such that each of the plurality of capping portions has a height ranging from 2.0 nm to 8.5 nm.

12. The method according to claim 10, wherein the plasma treatment process is conducted at a plasma bias power ranging from 101 W to 300 W such that each of the plurality of capping portions has a height ranging from 8.5 nm to 12.0 nm.

13. The method according to claim 10, wherein the plasma treatment process is conducted at a plasma bias power ranging from 301 W to 999 W such that each of the plurality of capping portions has a height ranging from 12.0 nm to 15.0 nm.

14. The method according to claim 10, further comprising forming a plurality of dummy films, each of which is disposed between a corresponding one of the plurality of dielectric spacers and a corresponding one of the plurality of dielectric portions, the plurality of recesses being formed by removing the plurality of dummy films using an isotropic etching process based on a relatively high etching selectivity of the plurality of dummy films with respect to the plurality of dielectric spacers, the plurality of dielectric portions, and the dielectric layer.

15. The method according to claim 10, further comprising:

removing the dielectric layer using an isotropic etching process based on a relatively high etching selectivity of the dielectric layer with respect to the plurality of dielectric spacers, the plurality of dielectric portions, and the plurality of capping portions;

removing bottom portions of the plurality of dielectric spacers by an anisotropic etching process; and filling a metal material into the openings so as to form a plurality of metal contacts, each of which is laterally covered by a corresponding one of the plurality of dielectric spacers.

16. A method for manufacturing a semiconductor device, comprising:

forming a structure on a substrate, the structure including:
a first source/drain region and a second source/drain region,
a channel region disposed between the first source/drain region and the second source/drain region,
a first dielectric spacer and a second dielectric spacer disposed on the first source/drain region and the second source/drain region, respectively, and
a dielectric portion disposed over the channel region, such that the first dielectric spacer is spaced apart from the dielectric portion by a first recess and such that the second dielectric spacer is spaced apart from the dielectric portion by a second recess; and subjecting the first dielectric spacer, the second dielectric spacer, and the dielectric portion to a plasma treatment process such that the first dielectric spacer, the second dielectric spacer, and the dielectric portion are deformed to form a first capping portion and a second capping portion to cap the first recess and the second recess, respectively, so as to form a first air gap and a second air gap covered by the first capping portion and the second capping portion, respectively.

17. The method according to claim 16, wherein the first recess and the second recess are formed by forming a first dummy film between the first dielectric spacer and the dielectric portion, and a second dummy film between the second dielectric spacer and the dielectric portion; and removing the first dummy film and the second dummy film using an isotropic etching process based on a relatively high etching selectivity of each of the first dummy film and the second dummy film with respect to the first dielectric spacer, the second dielectric spacer, and the dielectric portion.

18. The method according to claim 17, wherein the first dielectric spacer and the second dielectric spacer are formed by conformally depositing a dielectric film to cover the dielectric portion, the first dummy film, and the second dummy film; and removing a portion of each of the dielectric film, the dielectric portion, the first dummy film, and the second dummy film.

19. The method according to claim 16, further comprising: filling a dielectric layer into a first opening and a second opening respectively defined by the first dielectric spacer and the second dielectric spacer, wherein the dielectric layer includes a first dielectric part separated from the first source/drain region by the first dielectric spacer, and a second dielectric part separated from the second source/drain region by the second dielectric spacer.

20. The method according to claim 16, wherein the first air gap is formed between the first capping portion and the first source/drain region.

* * * * *